(12) United States Patent
Lee et al.

(10) Patent No.: US 6,459,637 B1
(45) Date of Patent: Oct. 1, 2002

(54) ZERO MARGIN ENABLE CONTROLLING APPARATUS AND METHOD OF SENSE AMPLIFIER ADAPTED TO SEMICONDUCTOR MEMORY DEVICE

(75) Inventors: Kwang-Jin Lee; Jong-Cheol Lee, both of Seoul (KR)

(73) Assignee: Samsung Electronics Co., Ltd., Suwon (KR)

(*) Notice: Subject to any disclaimer, the term of this patent is extended or adjusted under 35 U.S.C. 154(b) by 0 days.

(21) Appl. No.: 09/895,196

(22) Filed: Jun. 29, 2001

(30) Foreign Application Priority Data

Feb. 12, 2001 (KR) .............................................. 01-6677

(51) Int. Cl.[7] ................................................ G11C 7/00
(52) U.S. Cl. .................... 365/201; 365/225.7; 365/205; 365/196
(58) Field of Search ................................ 365/201, 196, 365/205, 208, 230.02, 225.7

(56) References Cited

U.S. PATENT DOCUMENTS 5,245,578 A * 9/1993 McLaury ............... 365/189.05
5,712,477 A * 1/1998 Delaney et al. ............. 250/221

* cited by examiner

Primary Examiner—Hoai Ho
Assistant Examiner—Thong Le
(74) Attorney, Agent, or Firm—F. Chau & Associates, LLP

(57) ABSTRACT

An apparatus for controlling an enable of a sense amplifier in a semiconductor memory device includes a test part for repeatedly varying a test code value until the enable of the sense amplifier has a zero margin with respect to data to be read by the sense amplifier, and for determining the test code value at a time point when the enable has the zero margin. A fuse array cuts a fuse corresponding to the determined test code value.

17 Claims, 5 Drawing Sheets

ZERO MARGIN ENABLE CONTROLLING APPARATUS AND METHOD OF SENSE AMPLIFIER ADAPTED TO SEMICONDUCTOR MEMORY DEVICE

BACKGROUND

1. Technical Field

The present invention relates generally to semiconductor memory devices and, more particularly, to an apparatus and method for controlling a time point at which a sense amplifier is enabled in a semiconductor memory device. The invention allows for a zero margin to be obtained in software regarding the enabling time point of the sense amplifier.

2. Background Description

In general, when a semiconductor memory device executes a read operation, a word line is enabled and, after a constant time, a sense amplifier (hereinafter also referred to as "S/A") is enabled to read cell data. However, it cannot be surely guaranteed that the stored cell data is sufficiently developed to a local data line at a time point when the sense amplifier is enabled. In other words, the word line and a sense amplifier enable signal are not exactly in synchronization. As used herein, the term "margin" corresponds to a difference between a time point or time period when data stored in a cell is sufficiently developed to a local data line (i.e., a current or voltage representative of the data is within a predefined threshold) and a time point or time period when the sense amplifier that "senses" the data is enabled. Moreover, as used herein, the phrase "zero margin" refers to when the preceding defined difference is substantially equal to zero (the local data line and the sense amplifier enable signal are in synchronization). Most semiconductor memory devices include a unit that is capable of controlling an enable of the sense amplifier disposed therein. In general, a fuse option is used. When an appropriate enabling time point of the sense amplifier is determined by the cutting of a fuse(s) during the initial product development, the enabling time point is used without change when there are no problems with the operating speed of the product.

FIG. 1 is a diagram illustrating an enable controlling apparatus of a conventional sense amplifier. The apparatus includes a row address decoder 10, a tracking unit 20, and a fuse array 30. A word line is activated when a row address and a block address are simultaneously selected, and an S/A enable signal is activated with the block address and a fuse array signal. A time point of the S/A enable signal is controlled by cutting a fuse of the fuse array 30. However, if the fuse cutting is controlled, the enabling time point of the sense amplifier for a corresponding chip is always fixed.

In the case of a plurality of chips, if there is a characteristic difference between each of the chips, the same cutting of the fuse array in all of the chips poses a problem in that the enabling time point of the sense amplifier is not optimized for each chip. In particular, when the operating speed of the semiconductor memory device barely satisfies a target operating speed, the conventional cutting system for the fuse array is not desirable. In this case, an evaluation period for an initial product is increased and a chip is consumed for the sake of the evaluation. Accordingly, there is a need for an apparatus and method for controlling a time point at which a sense amplifier is enabled in a semiconductor memory device that overcomes the above-described problems of the prior art.

SUMMARY OF THE INVENTION

The problems stated above, as well as other related problems of the prior art, are solved by the present invention, a zero margin enable controlling apparatus and method of a sense amplifier in a semiconductor memory device. Advantageously, the present invention determines an optimum enabling time point of the sense amplifier on a per chip basis, and cuts fuses in accordance therewith. Moreover, the present invention determines an optimum enabling time point of the sense amplifier using software.

According to an aspect of the invention, there is provided an apparatus for controlling an enable of a sense amplifier in a semiconductor memory device. The apparatus includes a test part for repeatedly varying a test code value until the enable of the sense amplifier has a zero margin with respect to data to be read by the sense amplifier, and for determining the test code value at a time point when the enable has the zero margin. A fuse array cuts a fuse corresponding to the determined test code value.

According to another aspect of the present invention, there is provided a method for controlling an enable of a sense amplifier in a semiconductor memory device. The semiconductor memory device has a test part and a fuse array. The test part determines a zero margin enabling time point of the sense amplifier through a test that uses a variable code. The method includes the step of executing the test by varying a time point of the enable of the sense amplifier until the enable has a zero margin with respect to data to be read by the sense amplifier. A corresponding fuse is cut that is representative of a code value used at the time point when the enable has the zero margin in said executing step.

These and other aspects, features and advantages of the present invention will become apparent from the following detailed description of preferred embodiments, which is to be read in connection with the accompanying drawings.

DETAILED DESCRIPTION OF PREFERRED EMBODIMENTS

A general description of a zero margin enable controlling apparatus of a sense amplifier in a semiconductor memory device will now be given, followed by more detailed descriptions of the apparatus with respect to FIGS. 2–6. A time point at which a sense amplifier is enabled in a semiconductor memory device (hereinafter also referred to as "enabling time point") is controlled using software, and an optimization point of an enable signal (a time point of a zero margin enable) of the sense amplifier is determined. Subsequently, a fuse cutting is performed with respect to the optimization point. A zero margin enable controlling apparatus according to the present invention at least includes a test part and a fuse array. The test part repeatedly executes a test by varying a test code value until the enable of the sense amplifier becomes a zero margin, and also determines a code value provided at a time point when the enable of the sense amplifier becomes the zero margin. The fuse array is used to cut a corresponding fuse so as to become the code value decided by the test part.

Figure 1:
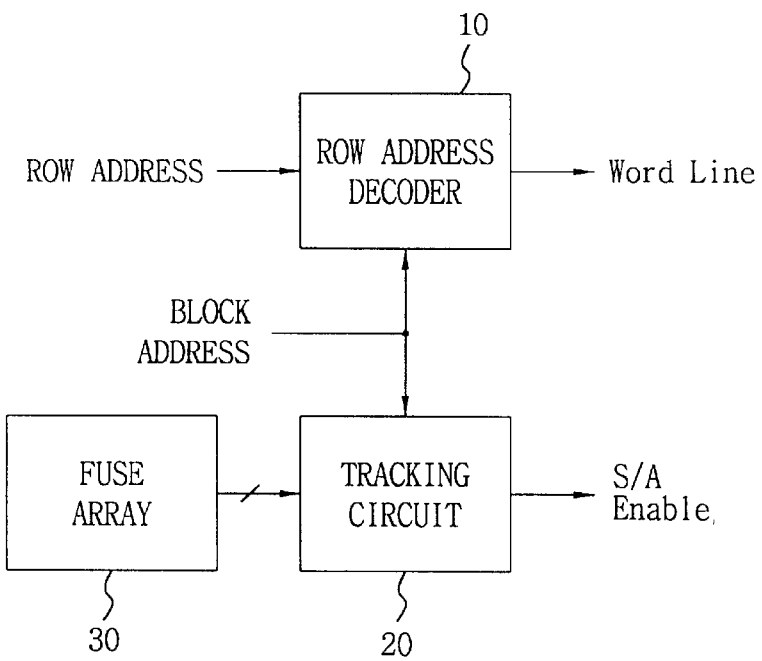
FIG. 1 is a block diagram illustrating an enable controlling apparatus of a conventional sense amplifier.
Figure 2:
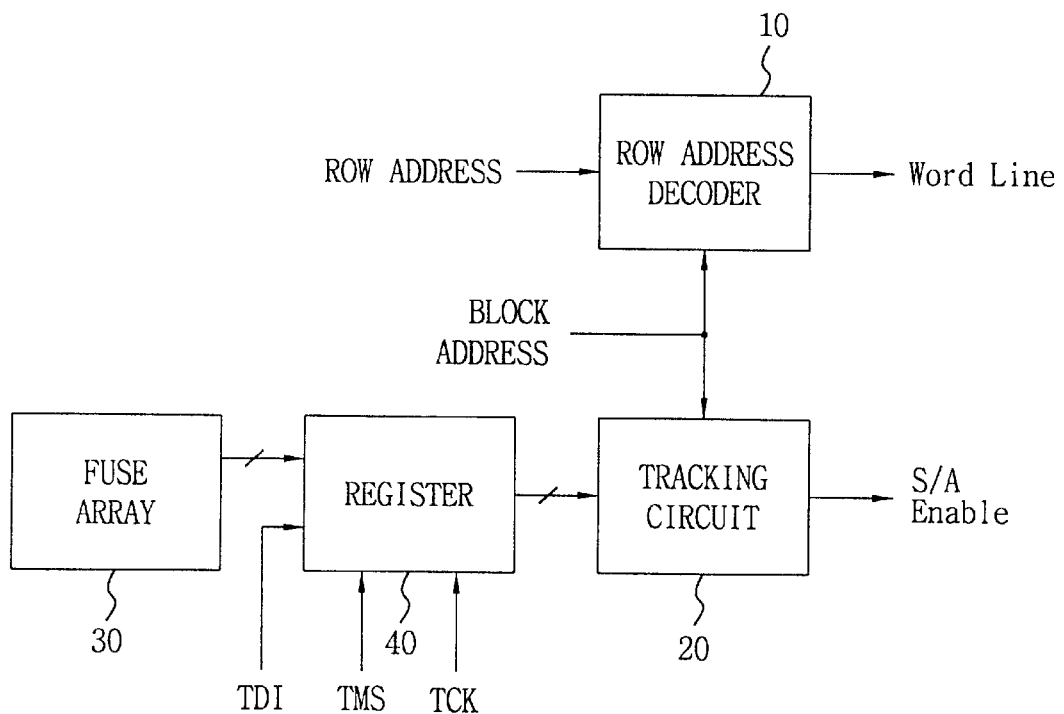
FIG. 2 is a block diagram illustrating a zero margin enable controlling apparatus of a sense amplifier in a semiconductor memory device, according to a preferred embodiment of the present invention.

FIG. 2 is a block diagram illustrating a zero margin enable controlling apparatus of a sense amplifier in a semiconductor memory device, according to a preferred embodiment of the present invention. The zero margin enable controlling apparatus of the present invention includes a row address decoder 10, a tracking circuit 20, a fuse array 30 and a register 40. The row address decoder 10 generates a word line signal by using a row address and a block address. The tracking circuit 20 generates an S/A enable signal by using the block address and fuse array information from the register 40. The fuse array 30 is constructed with a plurality of fuses for use of a delay, and outputs different output values according to the fuse cutting. The register 40 performs a test to decide the time point of zero margin enable of the sense amplifier before the fuse cutting, stores a code value corresponding to the time point of the zero margin enable, and then outputs fuse array information to the tracking circuit 20.

Figure 3:
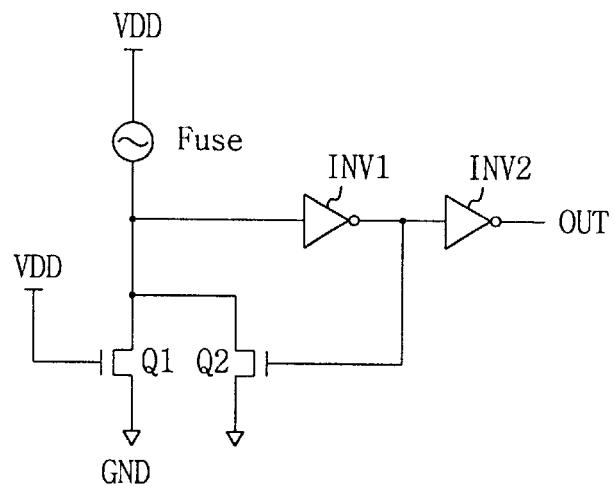
FIG. 3 is a circuit diagram illustrating a fuse array of FIG. 2, according to an illustrative embodiment of the present invention.

Various illustrative embodiments of the elements of the zero margin enable-controlling apparatus of FIG. 2 are shown in further detail with respect to FIGS. 3–6. FIG. 3 is a circuit diagram illustrating the fuse array 30 of FIG. 2, according to an illustrative embodiment of the present invention. A fuse cutting circuit for one fuse is shown in FIG. 3. One side of the fuse is connected to a power voltage VDD, and another side of the fuse is connected to a cathode of an inverter INV1 and also to the drains of transistors Q1 and Q2. A gate of the transistor Q1 is connected to the power voltage VDD, and a source of the transistor Q1 is grounded. A gate of the transistor Q2 is coupled with an anode of the inverter INV, and a source of the transistor Q2 is grounded. The inverter INV1 is coupled with a cathode of another inverter INV2, and an anode of the inverter INV2 is an output (OUT) of the fuse cutting circuit. In other words, in the fuse cutting circuit of FIG. 3, if the fuse is cut, then the output of the circuit becomes a logic "LOW", and if the fuse is not cut, then the output of the circuit becomes a logic "HIGH".

Figure 4:
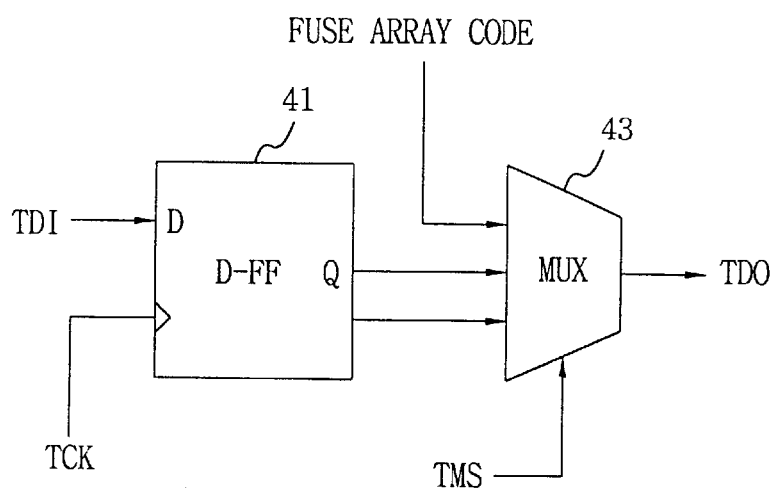
FIG. 4 is a circuit diagram illustrating a register of FIG. 2, according to an illustrative embodiment of the present invention.

FIG. 4 is a circuit diagram illustrating the register 40 of FIG. 2, according to an illustrative embodiment of the present invention. The register 40 is constructed by a D flip flop D-FF 41 and a 2:1 multiplexor 43. The register 40 operates as the above-mentioned test part. The D flip flop D-FF 41 receives a test clock (TCK) signal as a reference clock and a test data input (TDI) signal as a variable code input value. The multiplexor 43 receives an output signal of the D flip flop D-FF 41 and a fuse array code signal as input signals. The multiplexor 43 stores and determines a code value of the D flip flop D-FF 41 that is variably changed in response to a test mode select (TMS) signal until the code value becomes the zero margin enabling time point of the sense amplifier, and outputs to the tracking circuit a test data output (TDO) signal as an output signal corresponding to fuse array information when the code value becomes the zero margin enabling time point of the sense amplifier.

Figure 5:
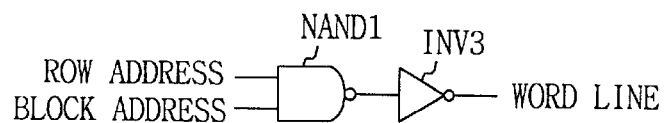
FIG. 5 is a circuit diagram illustrating a row address decoder of FIG. 2, according to an illustrative embodiment of the present invention.

FIG. 5 is a circuit diagram illustrating the row address decoder 10 of FIG. 2, according to an illustrative embodiment of the present invention. The row address decoder 10 is constructed with a NAND gate NAND1 having the row address and the block address as inputs, and an inverter INV3 whose cathode is connected to an output of the NAND gate NAND1 and whose anode output generates a word line.

Figure 6:
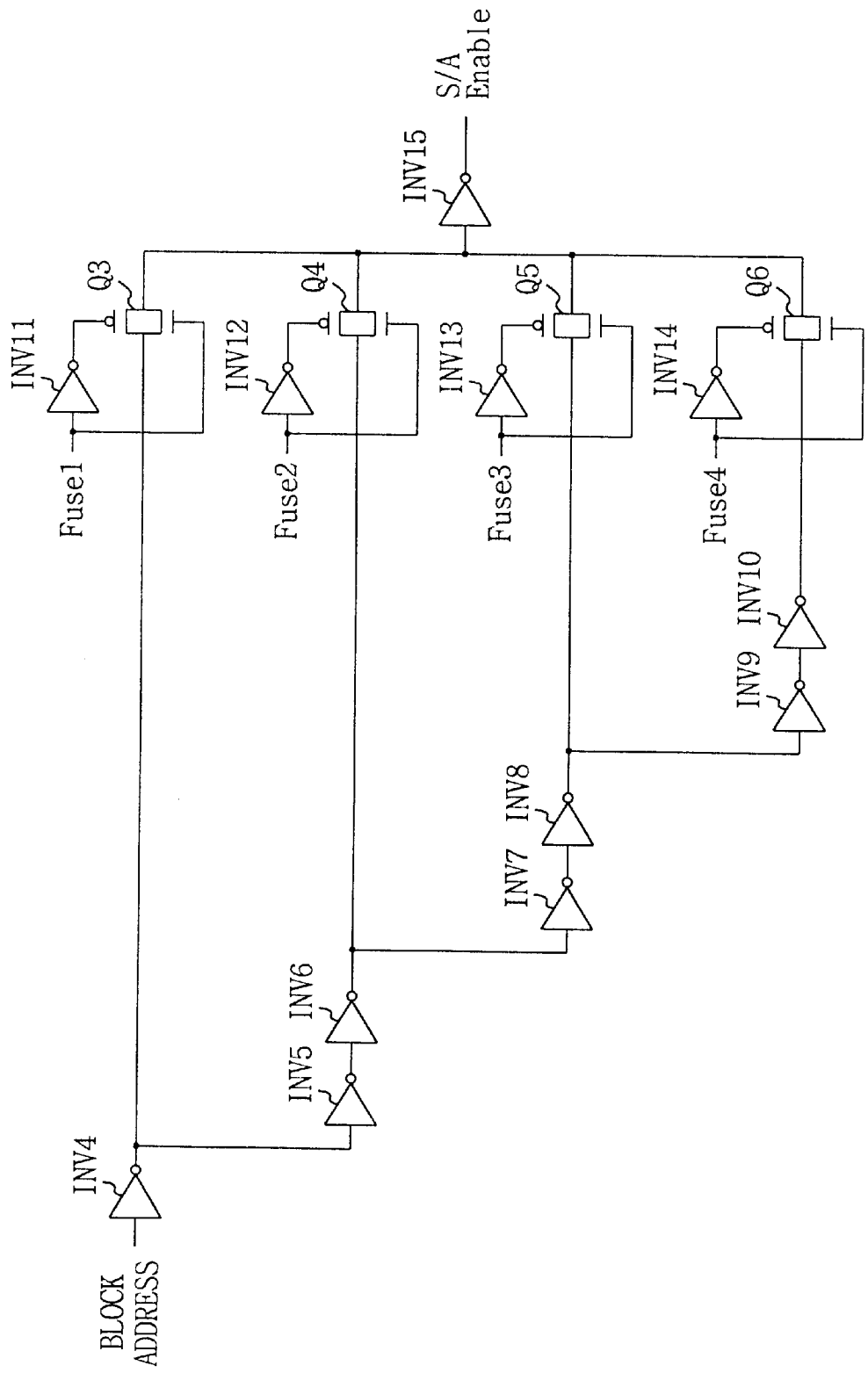
FIG. 6 is a circuit diagram illustrating a tracking circuit of FIG. 2, according to an illustrative embodiment of the present invention.

FIG. 6 is a circuit diagram illustrating the tracking circuit 20 of FIG. 2, according to an illustrative embodiment of the present invention. The tracking circuit 20 is operated by four fuses. Each fuse is connected to a PMOS transistor and is simultaneously connected to an NMOS transistor, through an inverter. Such PMOS transistor and NMOS transistor are connected with each other. Thus, a PMOS and NMOS transistor Q3 is connected to a fuse 1, a PMOS and NMOS transistor Q4 is connected to a fuse 2, a PMOS and NMOS transistor Q5 is connected to a fuse 3, a PMOS and NMOS transistor Q6 is connected to a fuse 4. The outputs of respective transistors Q3~Q6 generate an S/A enable through an output of inverter INV15. An input of the transistor Q6 is connected to two inverters INV10, INV9 in series. An input of the transistor Q5 is connected to two other inverters INV8, INV7 in series. An input of the transistor Q4 is connected to two other inverters INV6, INV5 in series. An input of the transistor Q3 is connected to an anode of an inverter INV4. A cathode of the inverter INV9 is connected between the inverter INV8 and the transistor Q5. A cathode of the inverter INV7 is connected between the inverter INV6 and the transistor Q4. A cathode of the inverter INV5 is coupled between the inverter INV4 and the transistor Q3. A cathode of the inverter INV4 is connected to the block address. Therefore, in the inventive tracking circuit 20, each fuse information applying circuit represents a delay selection signal, and each path indicates a delay path. That is, in the tracking circuit 20, when a corresponding delay path is decided by the delay selection signal, block address information activates an S/A enable signal delayed by the selected delay path.

Therefore, in response to an input of the TMS signal, the zero margin enable controlling apparatus stores, at the register 40, a TDI serial signal instead of a signal of the fuse array, before cutting the fuse array 30. Subsequently, the semiconductor memory device operates normally so as to perform a testing operation to determine the time point of the zero margin enable that is provided as the optimum enabling time point of the sense amplifier.

Meantime, the TDI, TMS and TCK signals may allocate a specific test pin, and also, in the case that a joint test access group (JTAG) circuit is equipped therein with the semiconductor memory device, the test pins are allocated, thus the enable of the zero margin sense amplifier can be gained per chip without a specific installment of the test pins.

A description will now be given of a method for controlling the zero margin enable of a sense amplifier in a semiconductor memory device. The method includes the steps of executing a test by varying a time point of an enable of the sense amplifier until the enable becomes a zero margin. The method also includes the step of cutting a corresponding fuse so as to become a code value used at the time point when the enable of the sense amplifier becomes the zero margin in the test executing step. The semiconductor memory device at least contains a test part for deciding the time point of the zero margin enable using a variable code, and a fuse array.

Figure 7:
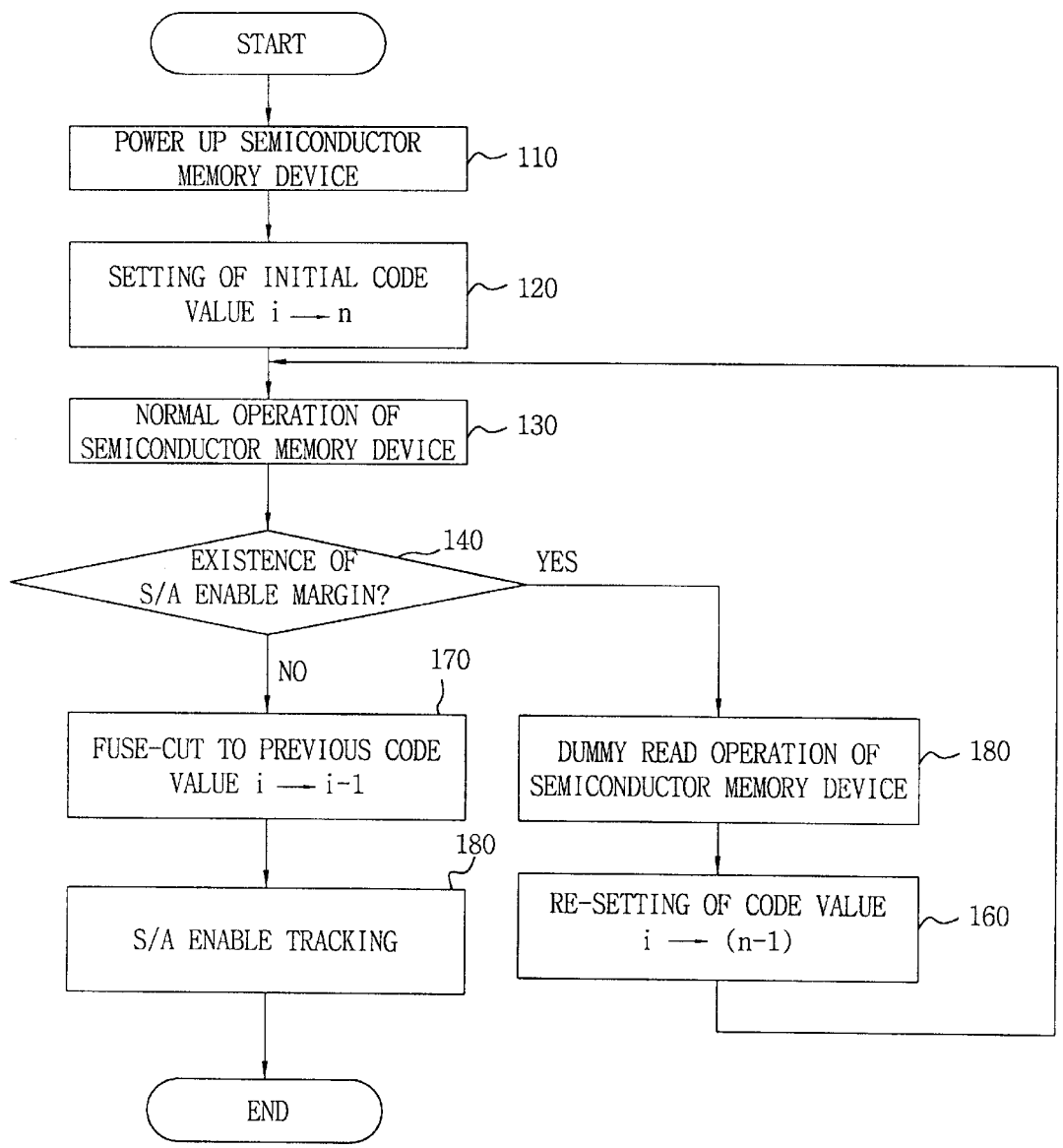
FIG. 7 is a flow diagram illustrating a method for controlling a zero margin enable of a sense amplifier in a semiconductor memory device, according to a preferred embodiment of the present invention.

FIG. 7 is a flow diagram illustrating a method for controlling a zero margin enable of a sense amplifier in a semiconductor memory device, according to a preferred embodiment of the present invention.

The semiconductor memory device is powered-up (step 110). A code value is determined in the register 40 as an initial value (step 120). At this time, it becomes "code i→n", wherein "n" indicates an initial code value and "i" represents a variable serial code value. The code "i" indicates a TDI signal value shown in FIGS. 2 and 4. When the initial code value is determined, the method proceeds to step 130 to normally operate the semiconductor memory device and perform several kinds of memory tests. It is then determined whether or not there exists a margin of the enabling time point of the sense amplifier (step 140). If it is determined that there exists the enabling margin of the sense amplifier at step 140, then the enable is considered to be not yet optimized and the method proceeds to step 150. At step 150, the semiconductor memory device is operated in a dummy read state. In this state, the code value is re-determined by inputting a new code value reduced from the initial value through the register 40 (step 160). At this time, it becomes "code i→n−1". In other words, the re-determined code value becomes the code value "n−1" reduced by a given amount from the initial code value n. After that, the method returns to step 130 to normally operate the semiconductor memory device and execute several kinds of memory tests. Thereby, the operation for determining whether or not there exists the margin for the enabling time point of the sense amplifier is repeatedly performed. If it is determined that the enabling margin of the sense amplifier no longer exists at step 140, so if an operation failure occurs, then step 170 is performed to decide that the code value "i−1" used in the previously executed testing procedure is a code value for a zero margin sense amplifier enable of a chip which is currently being tested, and to perform a fuse cutting of the fuse array 30 so as to generate the corresponding code value "i−1". Then, at step 180, fuse information is inputted to the tracking circuit 20 and becomes a delay selecting signal, and when a corresponding delay path is decided by the delay selection signal, block address information activates an S/A enable signal delayed by the selected delay path.

In such a programming test procedure, the zero margin enabling time point of the sense amplifier is obtained before the fuse cutting step, and then the fuse cutting is executed to obtain the zero margin S/A enable for each chip, and to also shorten an evaluation period for an initial product and prevent an inevitable consumption of chips for the evaluation.

Figure 8:
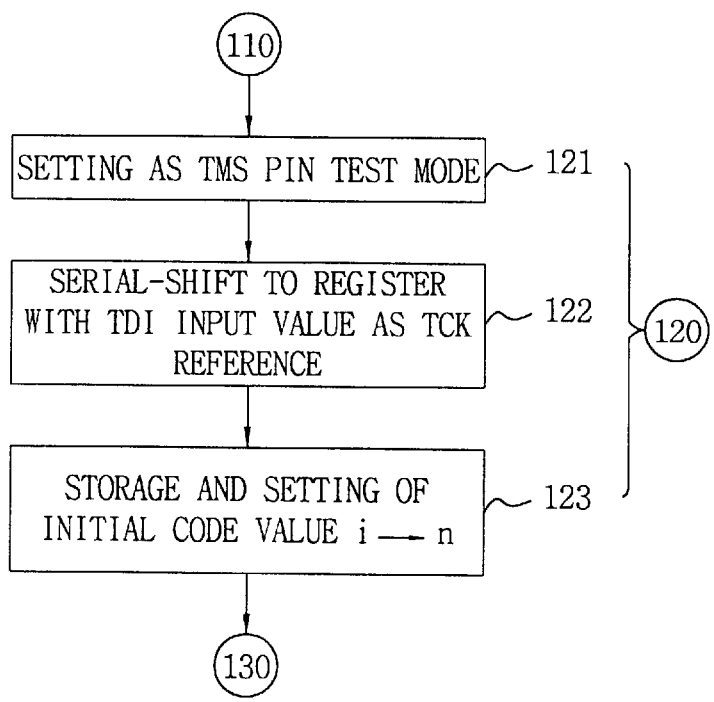
FIG. 8 is a flow diagram illustrating a register for an initial determination of a code value per step 120 of FIG. 7, according to an illustrative embodiment of the present invention.

FIG. 8 is a flow diagram illustrating a method for initially determining a code value by the register 40 per step 120 of FIG. 7, according to an illustrative embodiment of the present invention. When the semiconductor memory device is powered-up at step 110, a test mode is determined using the TMS pin (step 121), and the value inputted through the TDI pin instead of the fuse array information is serial-shifted to the register 40 with the TCK signal as the reference clock (step 122). Therefore, the serial-shifted value is stored and this value is determined as the initial code value "i→n" (step 123), and the method proceeds to step 130.

Figure 9:
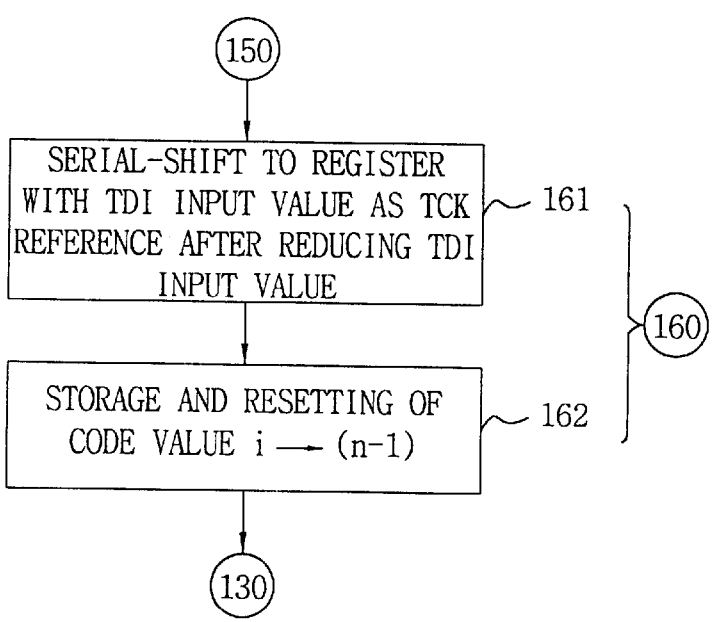
FIG. 9 is a flow diagram illustrating a method for re-determining a code value by the register 40 per step 160 of FIG. 7, according to an illustrative embodiment of the present invention.

FIG. 9 is a flow diagram illustrating a method for re-determining a code value by the register 40 per step 160 of FIG. 7, according to an illustrative embodiment of the present invention. An input value is applied for further reducing the enable margin through the TDI pin, and this value is serial-shifted to the register 40 with the TCK signal as the reference clock (step 161). Thus, the serial-shifted value is stored and is determined as a new code value "i→n−1" (step 162), and the method proceeds to step 130.

As described above, in operating the semiconductor memory device of the present invention, before the fuse cutting step the test is repeatedly performed by varying the enabling time point of the sense amplifier to determine an optimum time point for the enable signal of the sense amplifier. Then, a corresponding delay fuse is cut to obtain the zero margin S/A enable.

As described above, in accordance with the present invention, an optimum enabling time point of a sense amplifier of each chip is previously confirmed through a testing procedure in a semiconductor memory device and, subsequently thereto, a fuse cutting is executed. Therefore, there is an advantage of optimizing an enabling time point of the sense amplifier.

In addition, the optimum enabling time point of the sense amplifier per chip is determined in advance through the testing procedure in a software aspect and then, the fuse cutting is performed. Thus, an evaluation period for an initial product can be shortened and an inevitable consumption of chips for the evaluation can be prevented.

While the invention has been particularly shown and described with reference to preferred embodiments thereof, it will be understood by those skilled in the art that the foregoing and other changes in form and details may be made therein without departing from the spirit and scope of the invention.

What is claimed is:

1. An apparatus for controlling an enable of a sense amplifier in a semiconductor memory device, comprising:

a test part for repeatedly varying a test code value until the enable of the sense amplifier has a zero margin with respect to data to be read by the sense amplifier, and for determining the test code value at a time point when the enable has the zero margin; and a fuse array for cutting a fuse corresponding to the determined test code value.

2. The apparatus of claim 1, further comprising:

a tracking circuit for generating a sense amplifier enable signal, wherein said test part comprises:

a flip flop having a test data input pin and a test clock pin for receiving the varying test code value and a reference clock, respectively; and a multiplexor having a test mode select pin, for receiving an output signal of the flip flop and a fuse array code signal, for storing, in response to a test mode select signal applied through the test mode select pin, the varying test code value until the enable of the sense amplifier has a zero margin, and for outputting fuse array information corresponding to the zero margin to the tracking circuit when the enable of the sense amplifier has a zero margin.

3. The apparatus of claim 2, wherein the flip flop is a D type flip flop.

4. The apparatus of claim 2, wherein said semiconductor memory device has an installment of a joint test access group circuit therein to which the test pins are allocated.

5. The apparatus of claim 1, wherein said fuse array comprises at least one fuse cutting circuit.

6. The apparatus of claim 5, wherein the at least one fuse cutting circuit comprises:

first and second transistors, each having a gate, a source, and a drain, the gate of the first transistor coupled to a power supply voltage, the source of the first and second transistors coupled to a ground voltage;

first and second inverters, coupled in series, each having an input and an output; and a fuse having a first end and a second end, the first end coupled to the power supply voltage, and the second end coupled to the input of the first inverter and the drains of the first and second transistors, wherein the gate of the second transistor is coupled to an output of the first inverter and an input of the second inverter, and the output of the second inverter forms an output of said fuse cutting circuit.

7. A method for controlling an enable of a sense amplifier in a semiconductor memory device, the semiconductor memory device having a test part and a fuse array, the test part for determining a zero margin dnabling time point of the sense amplifier through a test that uses a variable code, said method comprising the steps of:

executing the test by varying a time point of the enable of the sense amplifier until the enable has a zero margin with respect to data to be read by the sense amplifier; and cutting a corresponding fuse representative of a code value used at the time point when the enable has the zero margin in said executing step.

8. The method of claim 7, wherein said executing step comprises the steps of:

powering up the semiconductor memory device;

determining an initial code value;

normally operating the semiconductor memory device and performing a memory test to determine whether there exists the zero margin enabling time point of the sense amplifier;

performing a dummy read operation by the semiconductor memory device when there does not exist the zero margin enabling time point of the sense amplifier, including inputting a new code value that is modified from a previous code value and returning to said operating step; and proceeding to said cutting step when there does exist the zero margin enabling time point of the sense amplifier.

9. The method of claim 8, wherein said determining step comprises the steps of:

determining a test mode; and determining the initial code value from a test input pin instead of fuse array information.

10. The method of claim 8, wherein said performing step comprises the step of reducing the previous code value to obtain the new code value.

11. A method for controlling an enable of a sense amplifier in a semiconductor memory device, the semiconductor memory device having a fuse array, said method comprising the steps of:

varying a code value that is representative of delays provided by the fuse array to obtain a zero margin between a time point at which the sense amplifier is enabled and another time point at which data read by the sense amplifier is within a predefined threshold;

identifying the code value corresponding to the zero margin; and cutting at least one fuse in the fuse array based upon the code value corresponding to the zero margin.

12. The method of claim 11, wherein said varying step is performed prior to cutting the at least one fuse in the fuse array.

13. The method of claim 11, wherein said varying step comprises the step of:

setting the code value to an initial code value;

determining whether the zero margin exists; and modifying the initial code value and returning to said determining step, when the zero margin does not exist, wherein the initial code value is progressively modified at each iteration of said modifying step until the zero margin exists.

14. The method of claim 13, wherein said determining step is performed as part of a dummy read operation.

15. The method of claim 13, wherein said modifying step comprises the step of serially shifting data through a flip flop.

16. The method of claim 11, further comprising the step of storing at least the code value corresponding to the zero margin.

17. The method of claim 13, wherein the code value corresponding to the zero margin is a previous code value with respect to a current determination of whether the zero margin exists.

* * * * *